(12) United States Patent
Moon et al.

(10) Patent No.: US 9,761,750 B2
(45) Date of Patent: Sep. 12, 2017

(54) LARGE CALIBER ARRAY TYPE TERAHERTZ WAVE GENERATING DEVICE HAVING PHOTONIC CRYSTAL STRUCTURE

(71) Applicant: ELECTRONICS AND TELECOMMUNICATIONS RESEARCH INSTITUTE, Daejeon (KR)

(72) Inventors: Ki Won Moon, Daejeon (KR); Kyung Hyun Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 132 days.

(21) Appl. No.: 14/964,557

(22) Filed: Dec. 9, 2015

(65) Prior Publication Data

US 2016/0170288 A1 Jun. 16, 2016

(30) Foreign Application Priority Data

Dec. 10, 2014 (KR) .................. 10-2014-0177677
Oct. 26, 2015 (KR) .................. 10-2015-0148491

(51) Int. Cl.
*G02F 1/35* (2006.01)
*H01L 31/09* (2006.01)
*G02F 2/02* (2006.01)

(52) U.S. Cl.
CPC .............. *H01L 31/09* (2013.01); *G02F 2/02* (2013.01); *G02F 2203/13* (2013.01)

(58) Field of Classification Search
CPC ...... G01J 3/02; G01J 3/42; G01J 3/108; G01J 3/0208; H01L 31/12; H01L 31/18; H01L 31/02327; H01L 31/03046
See application file for complete search history.

(56) References Cited

U.S. PATENT DOCUMENTS 5,663,639 A * 9/1997 Brown ............... H01L 31/1085
250/214 A
8,039,802 B2 * 10/2011 Shin ..................... G01J 3/10
250/341.1
(Continued)

FOREIGN PATENT DOCUMENTS

JP 2014-238319 A 12/2014
KR 10-2010-0107360 A 10/2010
(Continued)

OTHER PUBLICATIONS

A. Dreyhaupt et al., "High-intensity terahertz radiation from a microstructured large-area photoconductor", Applied Physics Letters 86, 121114, Mar. 17, 2005.
(Continued)

*Primary Examiner* — David E Smith
*Assistant Examiner* — Hsien Tsai
(74) *Attorney, Agent, or Firm* — Rabin & Berdo, P.C.

(57) ABSTRACT

Provided herein is a large caliber terahertz wave generating device having a photonic crystal structure. The device includes a first electrode and a second electrode. The first electrode includes a first line pattern extending in a first direction, second line patterns coupled to the first line pattern and extending in a second direction, and third line patterns which are coupled to the first line pattern, extend in the second direction, are disposed between the second line patterns, and are longer than the second line patterns. The second electrode includes a fourth line pattern which extends in the first direction, fifth line patterns coupled to the fourth line pattern and extending in the second direction, and sixth line patterns which are coupled to the fourth line pattern, extend in the second direction, are disposed between the fifth line patterns, and are longer than the fifth line patterns.

13 Claims, 13 Drawing Sheets

(56) References Cited

U.S. PATENT DOCUMENTS

2010/0155605 A1    6/2010  Choi et al.
2014/0197425 A1*   7/2014  Moon .................. H04B 10/90
                                                    257/84

FOREIGN PATENT DOCUMENTS

KR    10-2010-0128042 A    12/2010
KR    10-2011-0024753 A    3/2011

OTHER PUBLICATIONS

Gabor Matthäus et al., "Microlens coupled interdigital photoconductive switch", Applied Physics Letters 93, 091110, Sep. 3, 2008.
G. Matthäus, "Large-area microlens emitters for powerful THz emission", Appl Phys B (2009) 96: pp. 233-235, Jun. 18, 2009.
Data sheet, iPCAp-21-05-300-800-h.
Christopher W Berry et al., "Terahertz generation using plasmonic photoconductive gratings", New Journal of Physics, 14 105029, pp. 1-12, Oct. 30, 2012.
Shang-Hua Yang et al., "7.5% Optical-to-Terahertz Conversion Efficiency Offered by Photoconductive Emitters With Three-Dimensional Plasmonic Contact Electrodes", IEEE Transactions on Terahertz Science and Technology, vol. 4, No. 5, Sep. 2014.
C.W. Berry et al., "Significant performance enhancement in photoconductive terahertz optoelectronics by incorporating plasmonic contact electrodes", Nature Communications, DOI: 10.1038/ncomms2638, Mar. 27, 2013.
Kiwon Moon et al., "Bias field tailored plasmonic nanoelectrode for high-power terahertz photonic devices", Scientific Reports, 5:13817 DOI: 10.1038/srep13817, Sep. 8, 2015.

\* cited by examiner

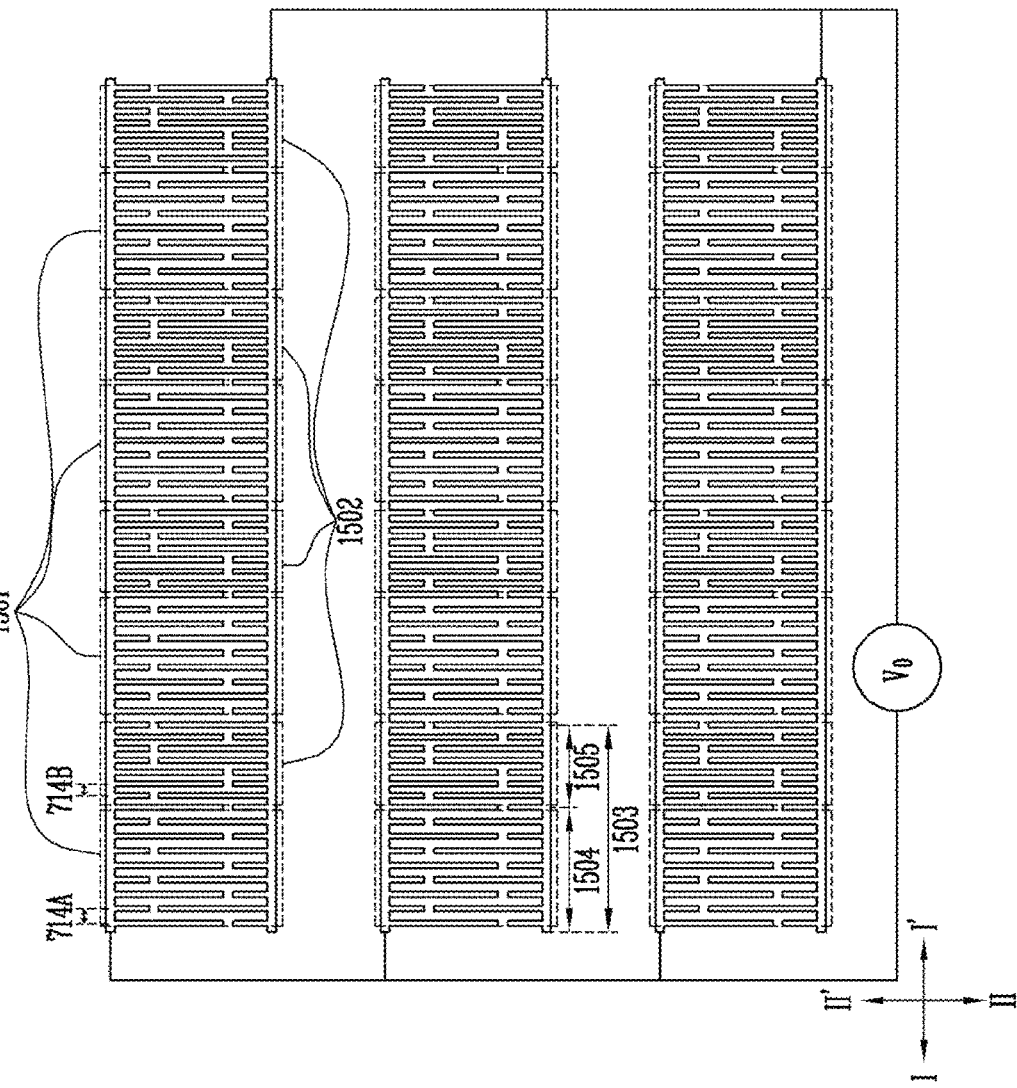

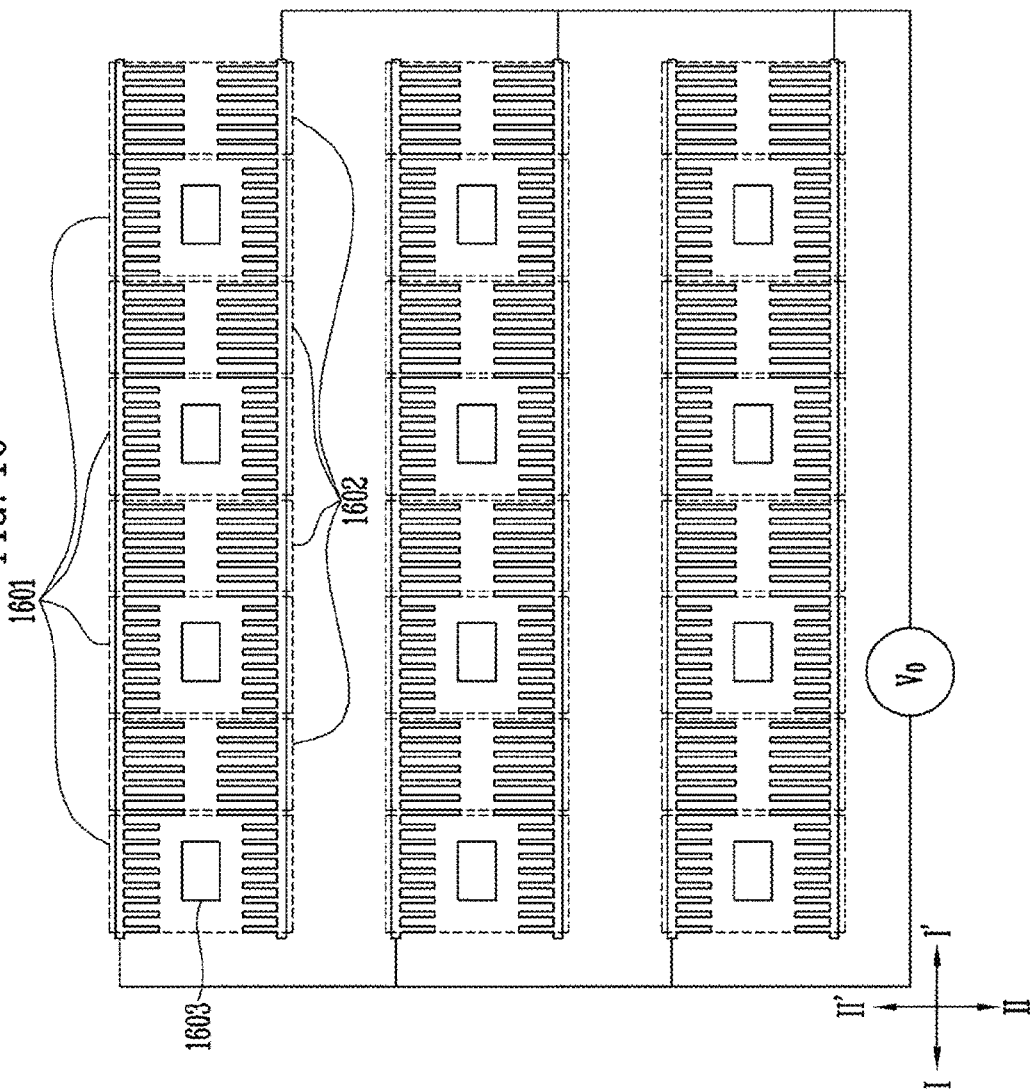

LARGE CALIBER ARRAY TYPE TERAHERTZ WAVE GENERATING DEVICE HAVING PHOTONIC CRYSTAL STRUCTURE

CROSS-REFERENCE TO RELATED APPLICATION

The present application claims priority to Korean patent application number 10-2014-0177677 filed on Dec. 10, 2014 and 10-2015-0148491, filed on Oct. 26, 2015, the entire disclosures each of which are herein incorporated by reference in their entirety.

BACKGROUND

Field of Invention

Various embodiments of the present disclosure relate to a light generation and absorption technology, and more particularly, to a continuous frequency variable and pulsed broadband photomixer technology for generating terahertz (THz) waves.

Description of Related Art

Terahertz (THz) waves are defined as waves in the region of 0.1 to 10 THz, where 1 THz is $10^{12}$ Hz, in an electromagnetic spectrum band. In particular, there are gyro and resonant frequencies of various molecules in the 0.1 to 3 THz region. Molecular fingerprints are obtained by using non-destructive, non-opening, and non-contact methods by utilizing the THz waves and thus it is possible to provide an advanced concept future core technology in medical treatment, medicine, agri-food, environment measurement, biology, communication, non-destructive inspection, and advanced material evaluation. Thus, intense competition is progressing in order to develop a related core technology.

The THz waves have little influence on a human body because they have very low energy of several meV. Accordingly, a THz wave processing technology is emerging as one of core technologies for realizing a human-oriented ubiquitous society, and it is expected that demands therefor sharply increase. Although a technology satisfying real time, portable, low-cost, and broadband issues at the same time has not yet been developed, various technologies on THz spectroscopy and imaging field utilization are being proposed due to persistent enhancement in technology.

The THz imaging field essentially employs a high output power and high sensitivity array type detector. On the other hand, since a broadband THz wave source is a core technology in the THz spectroscopy field, it is based on an optical technology. Hereinafter, a typical broadband THz system will be described with reference to drawings.

FIG. 1 is a view illustrating a configuration of a typical pulsed THz time domain spectroscopy (TDS) system.

Referring to FIG. 1, a typical broadband THz system is configured with a femtosecond-level high output pulse laser and a photoconductive antenna (PCA), and, by using a femtosecond-level ultra-short pulse laser, irradiates femtosecond-level ultra-short pulse laser beams on a semiconductor having an ultra high response speed to generate THz waves. Here, the femtosecond-level ultra-short pulse laser may be a Ti: sapphire laser, and the PCA, which is a THz wave generator due to femtosecond light excitation, may be configured with a super-high frequency photoelectric converter.

According to this structure, in the broadband THz system, 800 nm, which is a central oscillation wavelength of the commercialized Ti: sapphire laser, is absorbed and low-temperature-grown GaAs having a very short carrier lifetime is utilized as an active material of the PCA. In a configuration of the THz spectroscopy system, it is essential to adopt a material for efficiently absorbing excitation light or having a femtosecond-level carrier lifetime necessary for a broadband characteristic.

The broadband THz spectroscopy system is a first commercialized system because it is relatively easy to realize a high signal-to-noise ratio (SNR) and broadband characteristics. However, since a THz-TDS system is configured with a sophisticated and complicated optical system including a femtosecond-level ultra-short pulse laser and an optical delay, it is expensive and has a large size. In addition, at the time of measuring a time domain signal, it is difficult to measure in real time due to an optical delay time and a Fast Fourier Transform (FFT) signal processing time of the measured time domain signal.

FIG. 2 is a view illustrating a configuration of a continuous wave lasing THz-frequency domain spectroscopy (FDS) system.

Referring to FIG. 2, the THz-TDS system uses beating generated by two very stable and high output power wavelengths instead of the femtosecond-level ultra-short pulse laser beams as excitation laser beams. Except for a light source, a THz wave generating manner is similar to that of the THz-TDS system described in relation to FIG. 1.

For the PCA that is a super-high frequency photoelectric converter for the THz-TDS, it is possible to easily generate broadband THz waves by using a several micrometer-sized quadrilateral light excitation region and a very simple dipole antenna due to a high peak value of the ultra-short pulse laser beam. On the contrary, in the THz-FDS system of FIG. 2, since a THz wave having a frequency corresponding to the difference between two wavelengths is generated, a term "photomixer" is used instead of the term "PCA".

The pulsed THz-TDS system may provide high frequency resolution according to the continuous wave manner. In addition, the pulsed THz-TDS system uses two independent high output semiconductor lasers and accordingly enables low-price, broadband, and micro-sized system development. Therefore, since it is possible to develop a THz spectroscopy system as a site application type, many organizations competitively develop related technologies. However, the continuous wave manner does not show concrete and substantial system application cases due to poor photoelectric conversion efficiency thereof.

SUMMARY

Various embodiments of the present disclosure are directed to providing a nano electrode structure capable of improving a generation efficiency of terahertz (THz) waves and enabling a large caliber photoconductive antenna (PCA) and a photomixer to be manufactured.

One embodiment of the present disclosure provides a large caliber terahertz wave generating device having a photonic crystal structure, including: a first electrode including a first line pattern extending in a first direction, a plurality of second line patterns coupled to the first line pattern and extending in a second direction intersecting with the first direction, and a plurality of third line patterns coupled to the first line pattern and extending in the second direction, the plurality of third line patterns being disposed between the plurality of second line patterns and being longer than the plurality of second line patterns; and a second electrode disposed to face the first electrode and comprising a fourth line pattern extending in the first direction, a plurality of fifth line patterns coupled to the fourth line pattern and extending in the second direction, and a plurality of sixth line patterns coupled to the fourth line pattern and extending in the second direction, the plurality of sixth line patterns being disposed between the plurality of fifth line patterns and being longer than the plurality of fifth line patterns.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 15 illustrates a structure of a large caliber array type THz PCA to which a photonic crystal structure is modified and applied according to an embodiment of the present disclosure; and FIG. 16 illustrates a structure of a large caliber array type THz PCA to which a photonic crystal structure is modified and applied according to another embodiment of the present disclosure.

DETAILED DESCRIPTION

Figure 1:
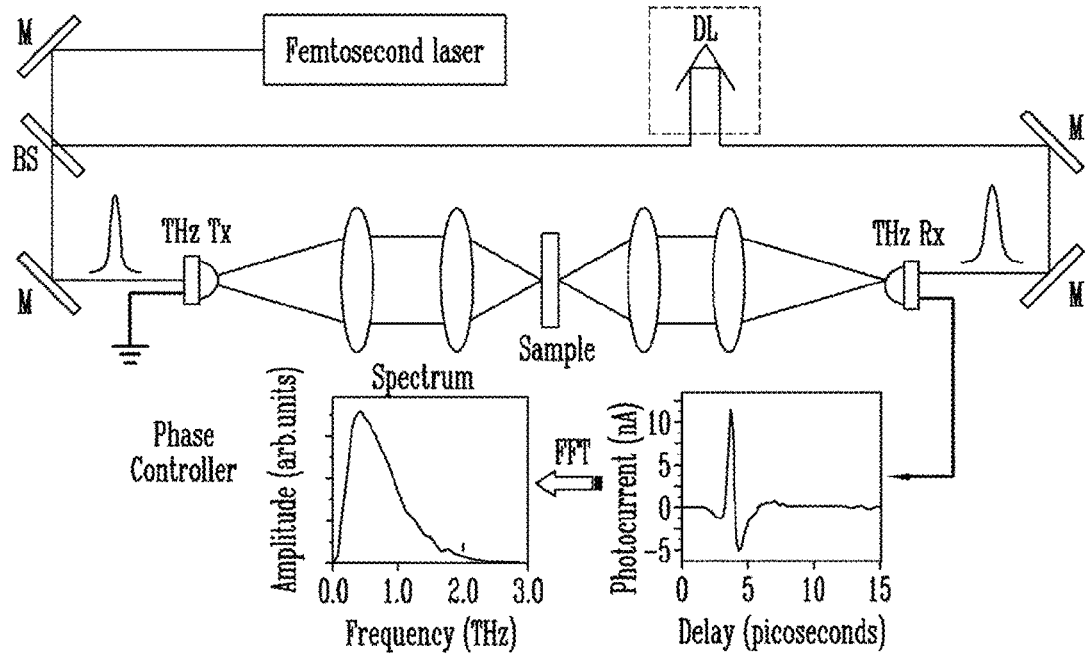
FIG. 1 is a view illustrating a configuration of a typical pulsed THz time domain spectroscopy system.
Figure 2:
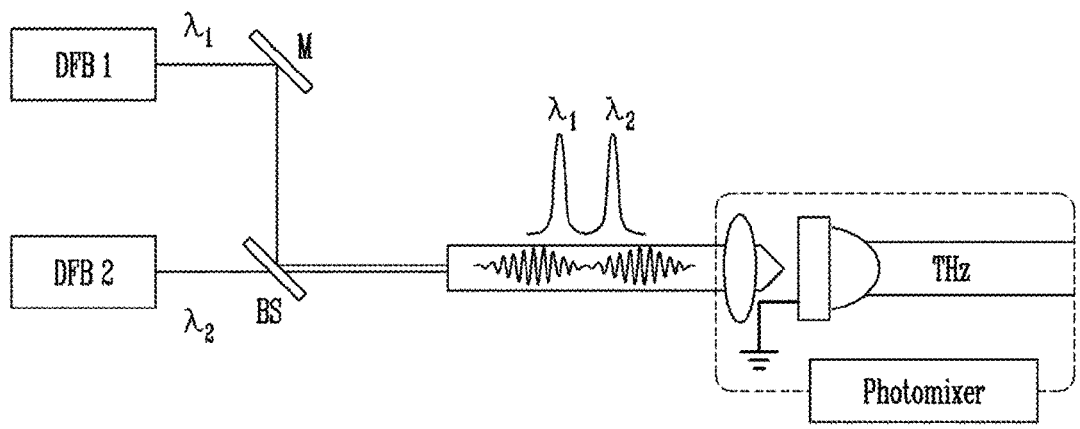
FIG. 2 is a view illustrating a configuration of a continuous lasing THz-frequency domain spectroscopy (FDS) system.

Hereinafter, embodiments of the present invention will be described in detail with reference to the accompanying drawings. In the drawings, the thicknesses and intervals are represented for convenience of explanation, and enlarged or exaggerated compared to the actual physical thicknesses and intervals. In describing the present invention, if a detailed explanation for a related known function or construction is considered to unnecessarily divert the gist of the present invention, such explanation will be omitted. It should be noted that like reference numerals refer to like constituent elements although they are illustrated in different drawings.

Figure 3:
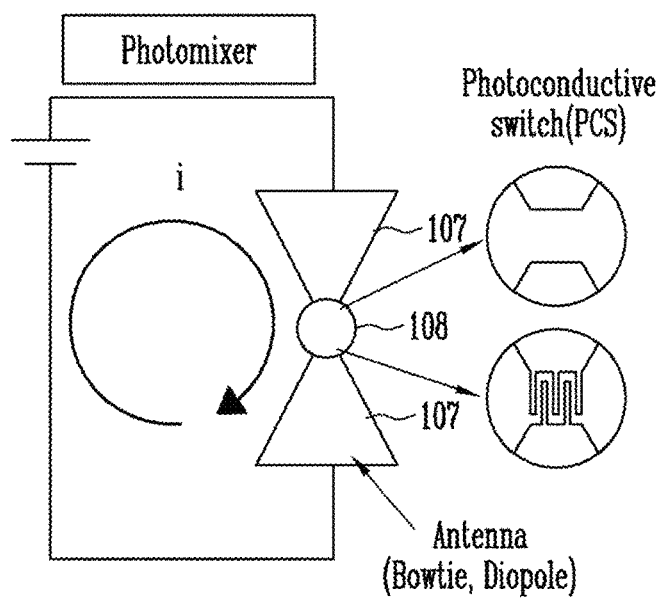
FIG. 3 is a view illustrating a circuit configuration of a typical photomixer for generating terahertz (THz) waves.
Figure 4:
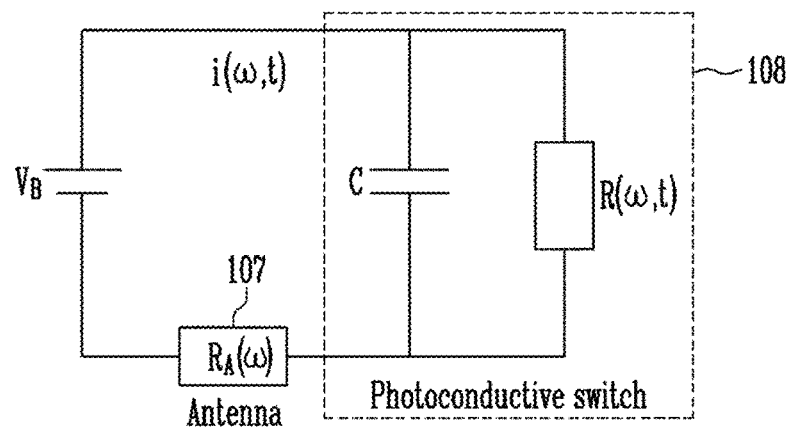
FIG. 4 is a view illustrating an equivalent circuit of the photomixer for generating THz waves according to FIG. 3.

FIG. 3 is a view illustrating a circuit configuration of a typical photomixer for generating terahertz (THz) waves, and FIG. 4 is a view illustrating an equivalent circuit of the photomixer for generating THz waves according to FIG. 3.

Referring to FIG. 3, a photomixer 30 is formed of a material of which a response speed is very rapid at a level of pico ($10^{-12}$) seconds. The photomixer 30 is configured with a photoconductive switch (PCS) 108 through which current flows at the time of being irradiated with light, and an antenna 107 for securing a gain in one direction of a generated THz wave.

Main characteristics of a pulsed broadband THz generating system or a continuous frequency variable THz generating system include characteristics of excitation light and a photoelectric efficiency of a photoconductive antenna (PCA), which is a photoelectric converter, or a photomixer. Unlike the pulse type, at the time of designing a photomixer for generating continuous waves, it is necessary to consider a heat rise effect in the photomixer due to very high input light power. Main heat sources include material absorption resulting from light injection and Joule heating by currents resulting from photomixer bias application.

When an internal temperature of a photomixer increases, incident light may be early saturated and the internal temperature rises and accordingly a decrease in photoelectric efficiency characteristic may be sharply progressed. Thus, smooth heat emission is necessary for securing high efficiency and in particular, considering heat emission in the continuous wave manner is important.

A photomixer for a long wavelength shows a poorest characteristic among several photoelectric converters. A generation frequency of a continuous frequency variable THz wave and the difference between two lasing wavelengths of excitation light have the relationship $f=c\Delta\lambda/\lambda^2$. The frequency of the THz wave is determined by the difference between frequencies $f_1=c/\lambda_1$, and $f_2=c/\lambda_2$ corresponding to lasing wavelengths of two independent laser beams that are excitation light. In this case, a characteristic of the generated frequency variable THz wave is directly influenced by the characteristic of the excitation light. Since all of stability, line width, polarization, and phase of the excitation light influence the generated THz wave, a stable excitation light source is necessary.

In order to analyze a THz wave output generated through a photomixer, an equivalent circuit as shown in FIG. 4 is frequently utilized. In FIG. 4, main variables that influence photomixer characteristics include an applied voltage $V_B$, antenna impedance $R_L$, photomixer capacitance C, and photomixer photoconductance $G_0$. When an area Ap where light enters, light transmittance T, internal quantum efficiency $h_i$, Planck constant h, charge mobility m, and frequency n are considered and it is assumed that there is a simple square type photomixer without any metal pattern on the area where light enters, the photoconductivity $G_0$ is given as the following Equation (1).

$$G_0 = \left(\frac{\mu_e \tau \eta_i T}{h\nu}\right)\frac{P_0}{A_p} \quad (1)$$

The characteristics of the THz wave output from the photomixer having $G_0$ are the same as the following Equation (2). In Equation (2), $R_A$ denotes a radiation resistance of the antenna, C and τ respectively denote an electrostatic capacity and a carrier decay time of a photoconductor.

$$P_{THz}(\omega) = \frac{\frac{1}{2}R_A G_0^2 V_B^2}{(1+(\omega\tau)^2)(1+(\omega R_A C)^2)} \quad (2)$$

In order to generate THz waves of a high efficiency, variables directly influencing on the photoelectric conversion efficiency of the photomixer are necessary to be adjusted together with a high output light source. As seen from Equation (2), the generation of the THz waves is influenced by the rapid response speed of the photomixer, the resistance of the antenna, and the intensity of an incident light, etc. In the PCA, which is a pulsed THz wave generator, degradation of characteristics due to the excitation light is relatively less influenced in comparison with the continuous wave manner. However, for a photomixer for generating the continuous wave, a temperature of an active layer is increased by continuous input light injection and absorption. In addition, since a junction temperature $T_j$ is formed at an interface between the air and the semiconductor by Joule heating due to bias application and a maximum value of the incident light is determined by $T_j$, degradation in characteristic due to the excitation light is necessary to be solved in order to develop a photomixer of high efficiency.

As seen from Equations (1) and (2), the characteristics of the broadband photomixer are influenced by a very short carrier decay time and electrostatic capacity characteristic of the photomixer. Among them, it is necessary to secure the carrier decay time which directly influence on broadband characteristics that are necessary for a THz spectroscope. In order to secure the carrier decay time, it is necessary to grow up a semiconductor material having a very short carrier decay time while retaining a single crystal characteristic of the semiconductor, and to this end, molecular beam epitaxy (MBE) equipment is typically used. Since the carrier decay time of a typical semiconductor is about several nano ($10^{-9}$) seconds and a time corresponding to 1 THz is about 1 pico ($10^{-12}$) second, the carrier decay time is necessary to be reduced to 1 picosecond for securing the broadband characteristic. To this end, a semiconductor crystal including impurities may be used. When a semiconductor crystal grows at a low temperature, an element of V group may occupy the location of an element of III group in a material and accordingly impurities are generated to secure a femtosecond-level carrier decay time.

In addition, a GaAs material may be utilized in order to absorb light of 800 nm that is the central lasing wavelength of a Ti: Sapphire laser that is a light source of the THz-TDS system, or an InGaAs material may be used to absorb long wavelength beating light.

Referring to FIGS. 3 and 4, the photomixer is configured with a PCS 108 for responding to excitation light at a high speed to generate a transient current having a picosecond-level duration time and an antenna 107 for radiating the generated current in an arbitrary direction in a space. Various kinds of antennas are selected for use and employed as the antenna 107 of the photomixer. The THz spectroscopy system necessarily uses a broadband antenna and uses a high-efficiency resonant antenna for the THz imaging system.

Figure 5:
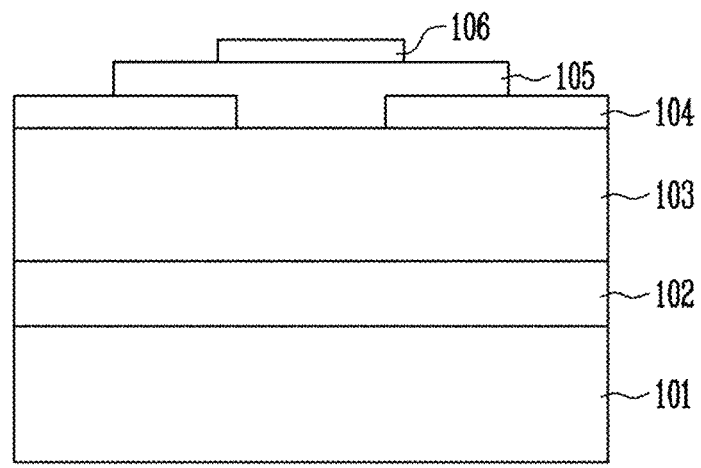
FIG. 5 is a cross-sectional view of a flat plate photomixer for generating THz waves.

FIG. 5 is a cross-sectional view of a flat plate photomixer for generating THz waves, and illustrates a simplest structure in which only an antenna is manufactured to enable bias application to a material for which a carrier decay time is secured.

Referring to FIG. 5, the photomixer includes a buffer layer 102, a photoconductive layer 103, an insulating thin film 104, a metal pattern 105, and an anti-reflection film 106, which are sequentially stacked on a substrate 101.

The substrate 101 may be a semi-insulating GaAs substrate or InGaAs substrate in order to minimize absorption of THz waves by charges in the semiconductor substrate.

The buffer layer 102 is for growing a normal semiconductor thin film on the substrate 101 and may include AlGaAs, InAlAs, GaAs, or InP etc.

The photoconductive layer 103 may grow through a low temperature method in order to secure a carrier lifetime. The semiconductor thin film utilized as an active layer may include GaAs of an 800 nm band in a bulk type and may include InGaAs or InGaAsP, etc., of which a band gap matches an excitation light wavelength for a long wavelength region. In addition to the bulk type active layer, it is also possible to adopt a multi-layer thin film structure such as InGaAs/InAlAs to easily capture electrons and holes generated by the long wavelength excitation light.

Referring to Equation (2), since a THz wave output is determined in proportion to the square of an applied voltage, an electrode may be formed to include an antenna for bias application at the time of forming the PCS.

The insulating thin film 104, the metal pattern 105, and the anti-reflection film 106 are formed by a series of lithography processes and through this, a photomixer chip is formed. Here, the anti-reflection film 106 is for reducing a surface reflection by the semiconductor, and is formed only on the region Ap where the light enters by using the lithography process after an anti-reflection layer is formed on the entire surface of the metal pattern 105.

Figure 6:
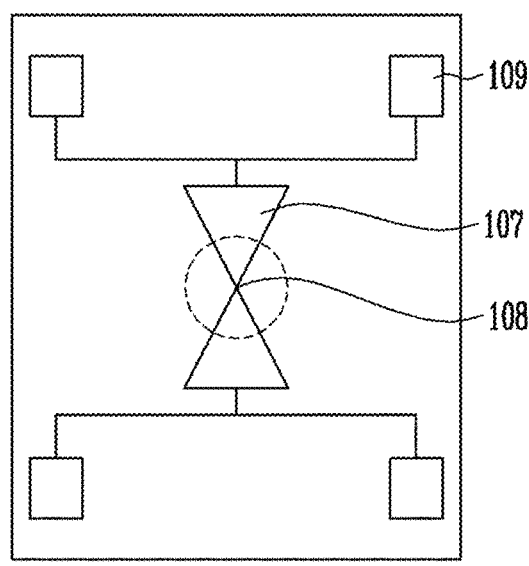
FIG. 6 is a view illustrating a flat plate shape of a photomixer for generating THz waves in which an antenna is integrated.

FIG. 6 is a view illustrating a flat plate shape of a photomixer for generating THz waves in which an antenna is integrated.

Referring to FIG. 6, the photomixer for generating THz waves includes a bowtie type antenna 107 as the broadband antenna. In addition, the photomixer for generating THz waves includes a pad 109 for packing and a PCS 108. Incident pulse light or continuous beating light is collected at an active region between electrodes of the PCS 108 and the focus diameter of the collected light is about 10 μm corresponding to an interval between the electrodes.

According to such a structure, a temperature may rise due to high optical density in the active region and accordingly a light efficiency may be lowered. In order to increase light collection, an additional optical system and high-precision light alignment are necessary, which leads to high cost and low productivity. For the broadband antenna such as the bowtie antenna 107, the spectrum characteristics of THz waves may depend on the frequency characteristics of the antenna. The broadband antenna does not have a flat signal magnitude of the spectrum and a flat phase spectrum, which are directly connected to precision of the THz spectroscope.

Accordingly, in order to address the foregoing issues, a photonic crystal-based PCS as shown in FIG. 7 is proposed in an embodiment of the present disclosure.

Figure 7A:
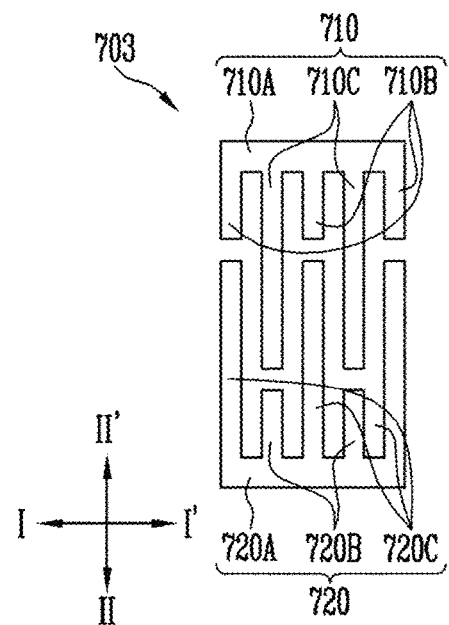
FIG. 7A is a view illustrating a nano electrode of an SNG structure according to an embodiment of the present disclosure.
Figure 7B:
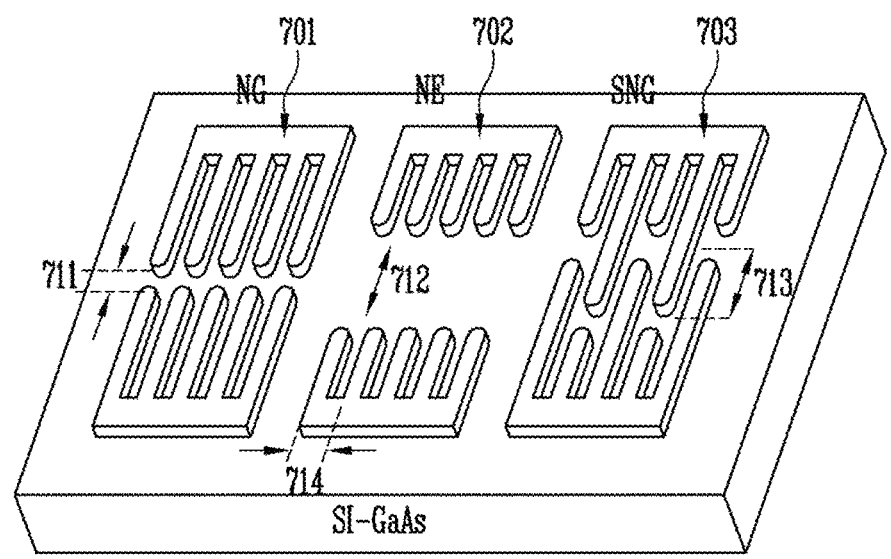
FIG. 7B is a view illustrating a comparison of an NG structure, an NE structure, and an SNG structure according to an embodiment of the present disclosure.

FIG. 7A is a view illustrating a nano electrode of a shifted nano-gap (SNG) structure according to an embodiment of the present disclosure, FIG. 7B is a view illustrating a comparison of a nano-gap (NG) structure, a nano-electrode (NE) structure, and an SNG structure according to an embodiment of the present disclosure.

Referring to FIG. 7A, a nano electrode 703 according to an embodiment of the present disclosure includes an SNG structure. The nano electrode 703 includes a pair of electrodes 710 and 720, and one of them may be a positive electrode and the other may be a negative electrode.

A first electrode 710 includes a first line pattern 710A extending in a first direction I-I' and a plurality of second and third line patterns 710B and 710C extending in a second direction II-II' intersected with the first direction I-I'. Here, one ends of the plurality of second and third line patterns 710B and 710C are connected to the first line pattern 710A. Accordingly, the first electrode 710 has a finger type or a comb type. In addition, the second line patterns 710B and the third line patterns 710C may be alternately arrayed and the third pattern lines 710C may be longer than the second line patterns 710B.

A second electrode 720 includes a fourth line pattern 720A extending in the first direction I-I' and a plurality of fifth and sixth line patterns 720B and 710C extending in the second direction II-II'. Here, one ends of the plurality of fifth and sixth line patterns 720B and 710C are connected to the fourth line pattern 720A. Accordingly, the second electrode 720 has a finger type or a comb type. In addition, the fifth pattern lines 720B and the sixth line patterns 710C may be alternately arrayed and the sixth line patterns 710C may be longer than the fifth line patterns 720B.

The first line pattern 710A of the first electrode 710 and the fourth line pattern 720A are disposed to face each other, and the pluralities of second, third, fifth, and sixth line patterns 710B, 710C, 720B, and 720C may be disposed between the first and fourth line patterns 710A and 720A.

In addition, the plurality of second line patterns 710B and the plurality of sixth line patterns 720C may be disposed to mutually correspond to each other, and the plurality of third line patterns 710C and the plurality of fifth line patterns 720B may be disposed to mutually correspond to each other. According to such a structure, the third line patterns 710C of the first electrode 710 and the sixth line patterns 720C of the second electrode 720 partially overlap.

Referring to FIG. 7B, the nano electrode according to an embodiment of the present disclosure may have an NG structure 701, an NE structure 702, or an SNG structure 703.

Here, the NG structure 701 is similar to the SNG structure, but the plurality of second line patterns 710b and the plurality of third line patterns 710C have the same length, and the plurality of fifth line patterns 720B and the plurality of sixth line patterns 720C have the same length. In addition, the NE structure 702 is similar to the NG structure 701, but intervals 711 and 712 between the positive and negative electrodes are different.

For example, the NG structure 701 is configured with a nano electrode array having a period 714 of about 200 nm. In addition, a pair of positive and negative electrodes may be included therein and the interval 711 therebetween may be about 200 nm. The NE structure 702 is similar to the NG structure and the interval 712 between the positive and negative electrodes is about 3 μm. The SNG structure 703 has a region 713 in which both electrodes mutually intersect with each other as described in relation to FIG. 7A. The width of the intersecting region 713 may be about 1 μm.

Figure 8A:
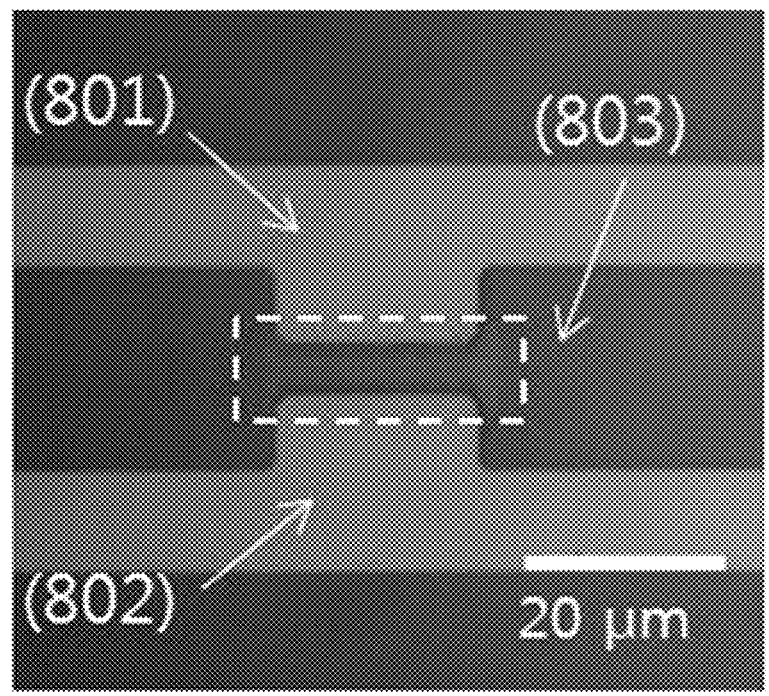
FIGS. 8A to 8D are electron microscope photos showing an actually manufactured example of a nano structure according to an embodiment of the present disclosure.
Figure 8B:
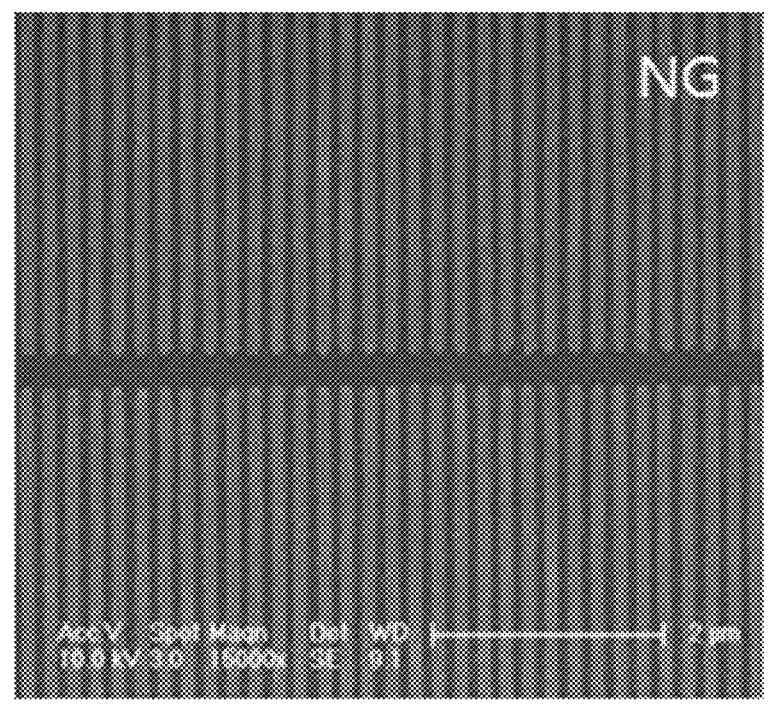
Figure 8C:
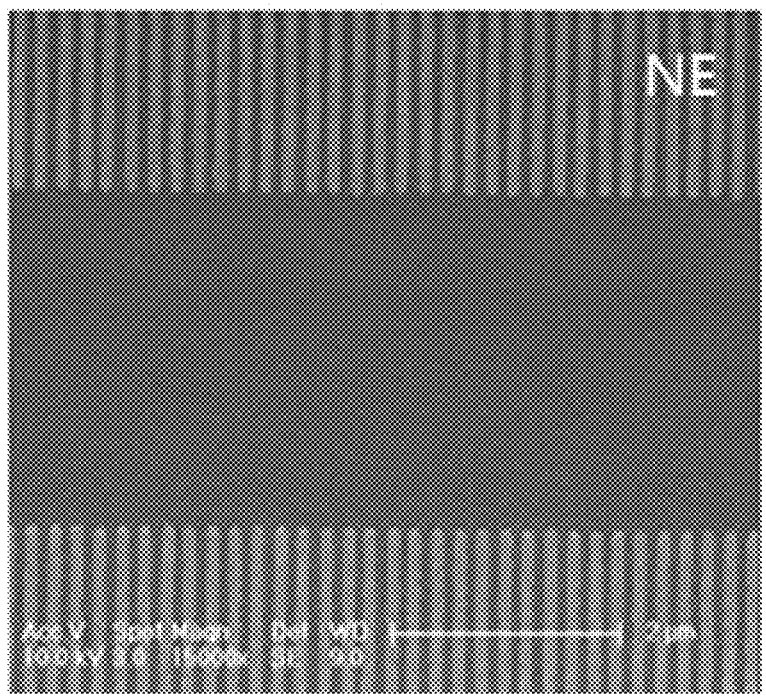
Figure 8D:
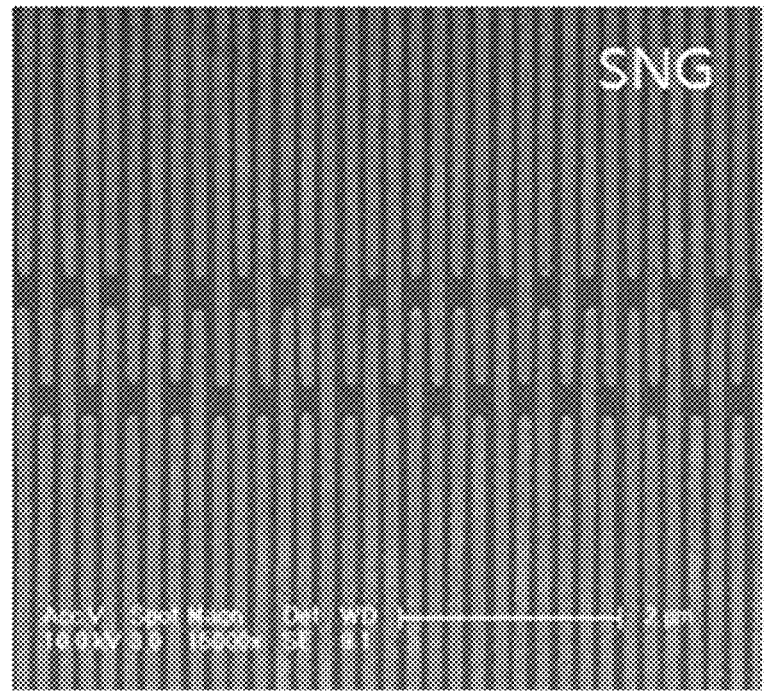

FIGS. 8A to 8D are electron microscope photos showing an actually manufactured example of a nano structure according to an embodiment of the present disclosure, FIG. 8A represents a structure of a THz PCA, and FIGS. 8B to 8D illustrate an enlarged portion 803 of FIG. 8A.

Referring to FIG. 8A, an H-dipole PCA structure manufactured for verifying the present disclosure includes a positive electrode 801 and a negative electrode 802, and the distance therebetween is about 5 μm and the width thereof is about 20 μm.

Referring to FIGS. 8B to 8D, the positive and negative electrodes 801 and 802 are separately arranged by a prescribed distance and may face each other with a portion thereof protruding. In addition, the protruding region 803 may have the NG, NE, or SNG structure described above in relation to FIG. 7B. The nano electrodes 801 and 802 were manufactured on an insulating GaAs semiconductor substrate. In addition, although not illustrated in the drawing, a reference sample, which does not include a nano structure, was also manufactured.

Figure 9:
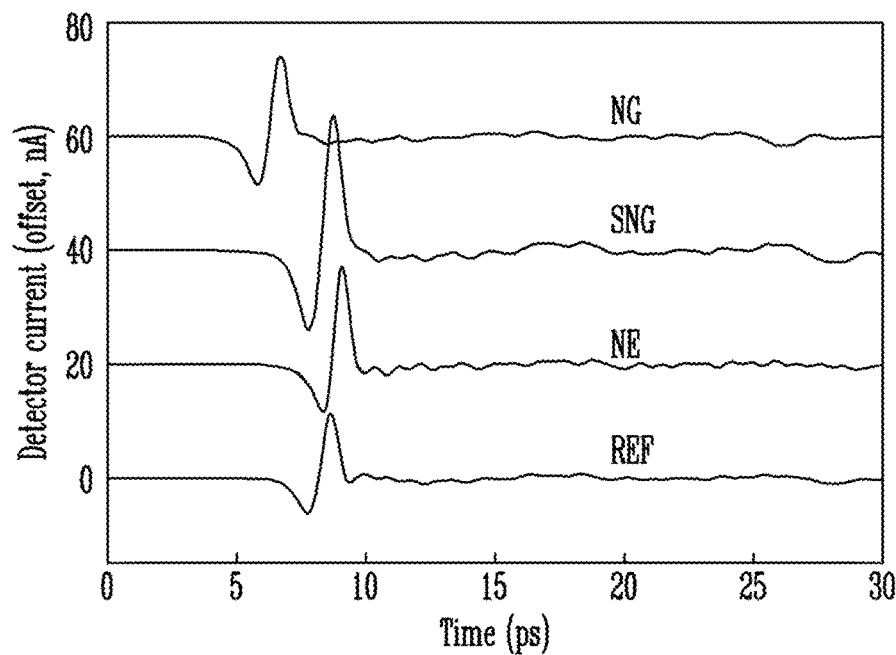
FIG. 9 is a graph showing a THz pulse generated in a THz photoconductive antenna (PCA) according to an embodiment of the present disclosure.

FIG. 9 is a graph showing a THz pulse generated in a THz PCA according to an embodiment of the present disclosure, and represents a characteristic measurement result of the nano electrode described in relation to FIGS. 8A to 8D. An x-axis of the graph denotes a time, and a y-axis denotes detection current.

The graph of FIG. 9 represents a THz release characteristic of each nano structure measured with the THz time domain spectroscopy. The measured values are obtained by applying a sine wave having the amplitude of 10V to an electrode of the H-dipole PCA and by generating a THz pulse by using a femtosecond laser pulse having an average power of 10 mW. Polarization of an incident wave is perpendicular to a direction of the nano electrode. Through the graph, it may be confirmed that the SNG structure has a highest efficiency.

Figure 10:
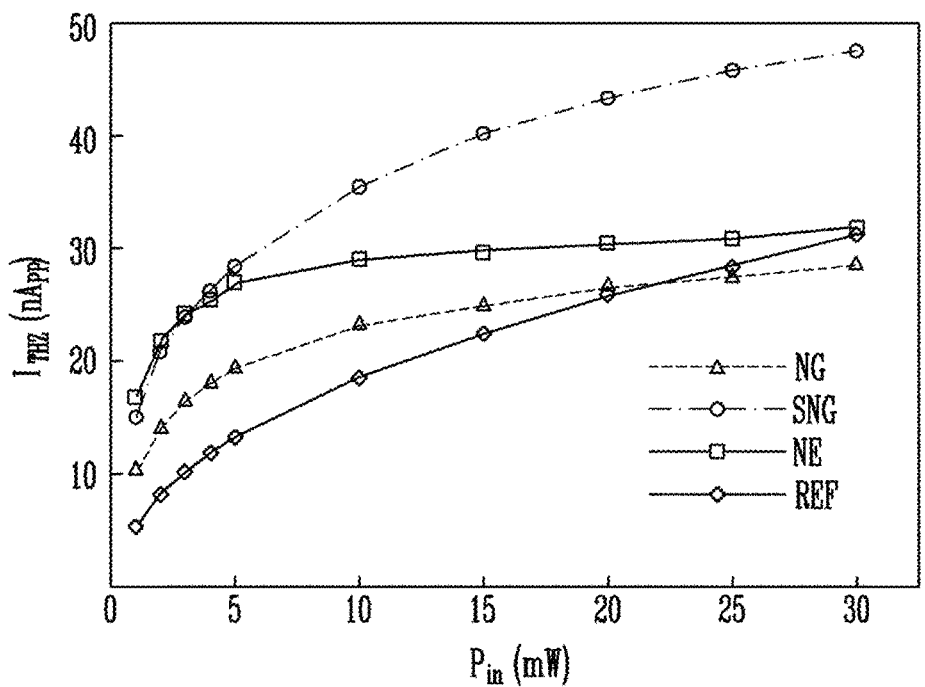
FIG. 10 is a graph showing a measurement result of the intensity of THz pulse according to the intensity of an incident light of a THz PCA according to an embodiment of the present disclosure.

FIG. 10 is a graph showing a measurement result of the intensity of THz pulse according to the intensity of an incident light of a THz PCA according to an embodiment of the present disclosure, and represents a characteristic measurement result of the nano electrode described in relation to FIGS. 8A to 8D.

The graph of FIG. 10 represents the amplitude of THz waves generated according to power of an incident wave. When the power of the incident wave is low, the reference sample REF generates a THz wave having smaller amplitude than that generated by the PCA having the nano structure. However, as the power of the incident wave increases, the reference sample REF generates a THz wave having similar amplitude to that generated by the NE or NG structure. For the NG and NE structures, when the power of the incident wave increases to be equal to or greater than a certain value, it may be confirmed that the amplitude of the THz wave is saturated.

Unlike this, a nano electrode of the SNG structure has a high efficiency for low incident wave power and saturation thereof is mitigated compared to other structures. In other words, a nano electrode of the SNG structure represents a high radiation efficiency for high incident wave power. For the SNG structure, since there is a region where positive and negative electrodes intersect with each other and electron collection efficiently occurs in the intersection region, it has an excellent effect. Accordingly, if necessary, the width 713 or period 714 of the intersection region may be adjusted to lead to an optimal efficiency.

As verified through the experiments, a radiation efficiency may be increased for the low incident light power by applying a nano structure electrode. Accordingly, a nano electrode of the SNG structure may be applied to a large caliber PCA to maximize the effect.

Figure 11:
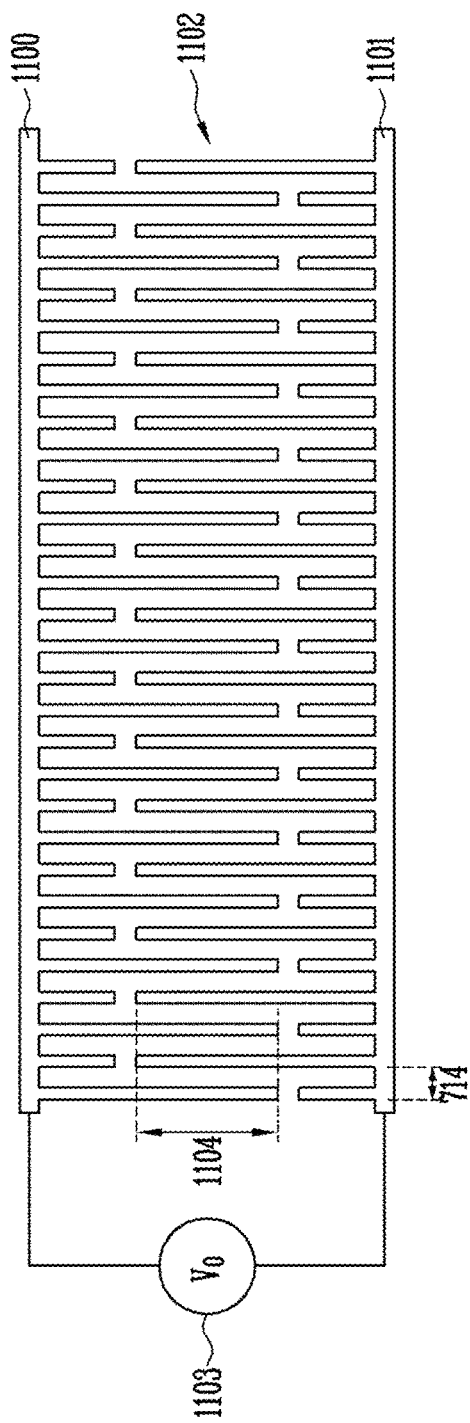
FIG. 11 illustrates a unit row structure of a large caliber array type THz PCA according to an embodiment of the present disclosure.

FIG. 11 illustrates a unit row structure of a large caliber array type terahertz PCA according to an embodiment of the present disclosure.

Referring to FIG. 11, a nano structure may be applied to electrodes forming one row of a large caliber PCA. For example, the SNG structure may be applied to two electrodes 1100 and 1101 facing each other and the two electrodes 1100 and 1101 are electrically controlled by a bias power source 1103. Here, the width 1104 and the period 714 of an intersection region may be diversely adjusted. In addition, not only the SNG structure but also the NG or NE structure may be applied.

Figure 12:
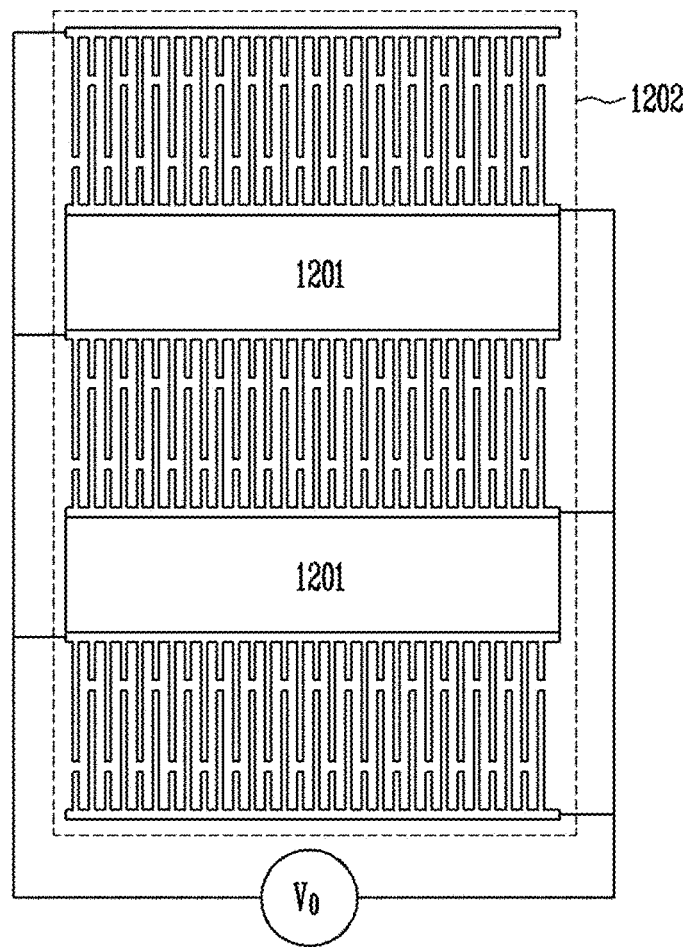
FIG. 12 illustrates a structure of a large caliber array type THz PCA according to an embodiment of the present disclosure.

FIG. 12 illustrates a structure of a large caliber array type THz PCA according to an embodiment of the present disclosure, and illustrates a structure of the large caliber THz PCA which is configured by arraying the one row described in relation to FIG. 11 in plural numbers.

Referring FIG. 12, reverse voltage regions 1201 are disposed between a plurality of rows and metal patterns may be formed on the reverse voltage regions 1201. Like this, a THz wave generation efficiency may be prevented from being lowered by covering the reverse voltage region 1201 with the metal patterns, etc. In addition, the size of the entire region 1202 may be diversely determined and for example, may be equal to or greater than 100 µm×100 µm.

Figure 13:
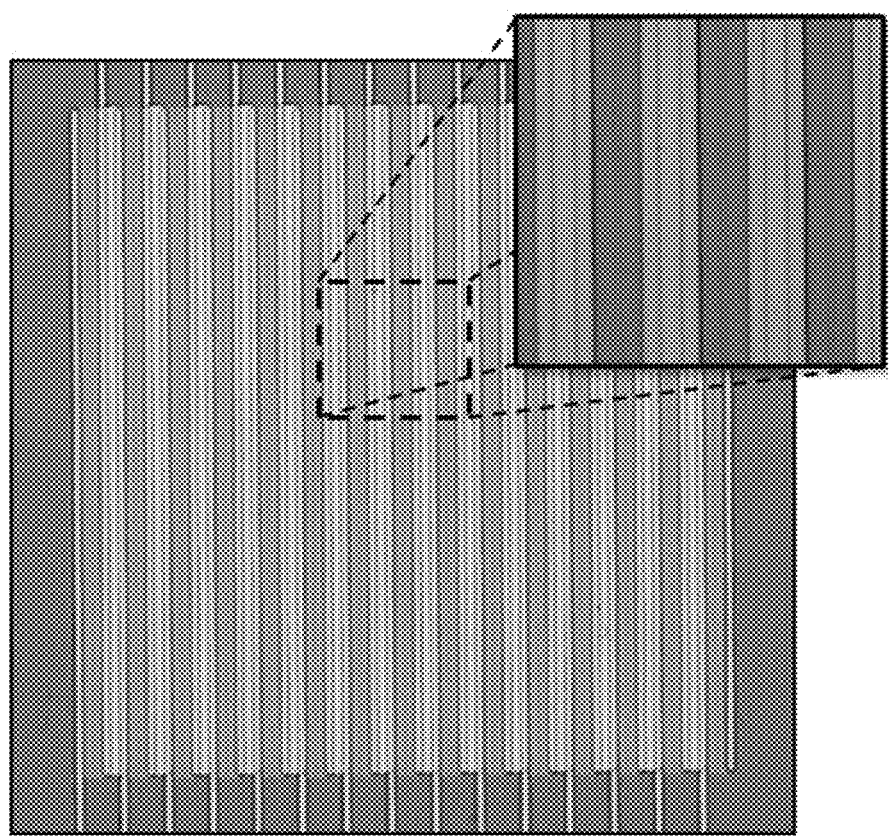
FIG. 13 is a microscope photo of a large caliber THz PCA actually manufactured.

FIG. 13 is a microscope photo of a large caliber terahertz PCA actually manufactured. Here, the area of the active region is 300 µm×300 µm and it may be confirmed that a nano structure is uniformly formed in the active region.

Figure 14A:
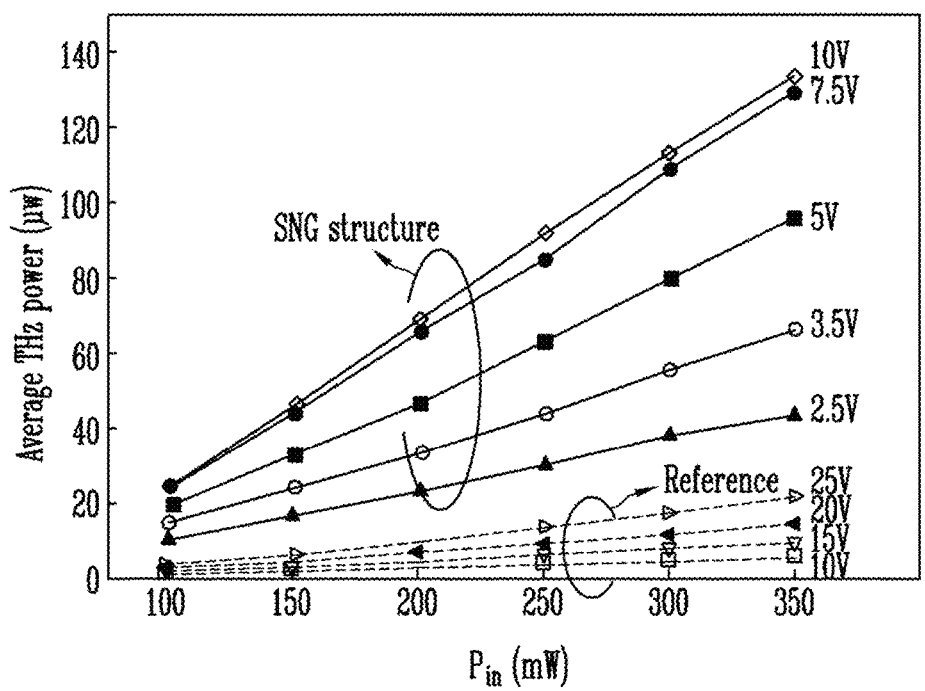
FIG. 14A is a comparison graph of output measurement results of a large caliber PCA to which an SNG structure is applied and a typical PCA that does not include a nano structure.

FIG. 14A is a comparison graph of output measurement results of a large caliber PCA to which an SNG structure is applied and a typical PCA that does not include a nano structure. The results measured with various bias voltages are compared and illustrated. Through this, the case to which the SNG structure is applied has an improved output by 20 times or greater at the same bias voltage, compared to a typical PCA that does not include the nano structure.

Figure 14B:
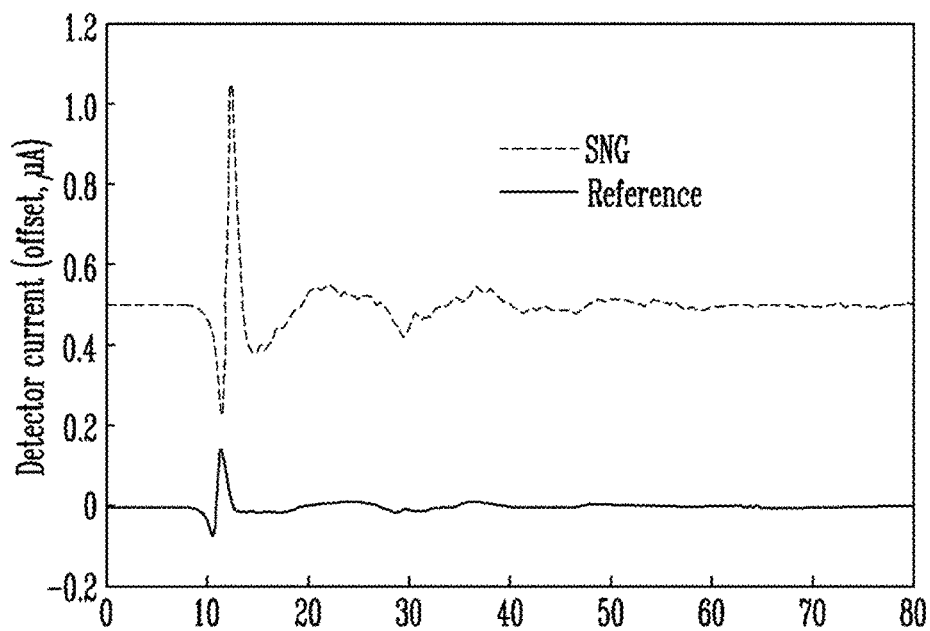
FIG. 14B is a comparison graph of THz time domain spectroscopy measurement results of a large caliber PCA using an SNG structure and a typical PCA that does not include a nano structure.

FIG. 14B is a comparison graph of THz time domain spectroscopy measurement results of a large caliber PCA using an SNG structure and a typical PCA that does not include a nano structure. Here, an x-axis denotes a time of which a unit is picosecond. A y-axis denotes detector current of which a unit is µA. Through the graph, it may be confirmed that an output power is remarkably improved by applying the SNG structure. In addition, it is also confirmed that a transient phenomenon occurring behind a main pulse is sufficiently limited.

Although FIGS. 14A and 14B represent measurement results only for a case to which the SNG structure is applied, it may be sufficiently seen that output power will be improved when the NG or NE structure is applied.

FIG. 15 illustrates a structure of a large caliber array type THz PCA to which a modified photonic crystal structure is applied according to an embodiment of the present disclosure.

Referring to FIG. 15, unit gratings 1501 and 1502 having different nano structures may be alternately arrayed on one row. For example, a PCA includes a first unit grating 1501 and a second unit grating 1502 alternately arrayed. The first unit grating 1501 has a first period 714A and has the structure described in relation to FIG. 7A. The second unit grating 1502 has a second period 714A and has a structure modified from the structure described in relation to FIG. 7A. For example, the second unit grating 1502 has a structure in which n second line patterns 710B, where n=2, are continuously arrayed and m third line patterns 710C, where m=2, are continuously arrayed. In other words, the n second line patterns 710B are continuously arrayed and then the m third line patterns 710C are continuously arrayed. Here, n and m may be natural numbers equal to or greater than 2. In addition, the period 1503 of the photonic crystal and the respective widths 1504 and 1505 of the unit gratings 1501 and 1502 may be set to be equal to or greater than 1 µm. For example, it may be designed such that a waveguide mode, which is formed between positive and negative electrodes of a unit row, has a forbidden frequency region in the band of 0.1 to 3 THz.

According to such a structure, a photonic crystal structure or a distributed Bragg reflector (DBR) structure may be realized to cut off the generated THz wave from being propagated through the electrodes. In addition, a ratio of THz waves to be released to the free space is increased and the frequency characteristics of the generated THz wave may be improved.

In the embodiments, the case where the SNG structure is applied to the photonic crystal structure or the DBR structure is illustrated, but the NG or NE structure may also be applied. In addition, it is also possible to combine to apply the SNG, NG, and NE structures, or two or more structures are periodically applied or non-periodically applied like a chirped grating structure.

FIG. 16 illustrates a structure of a large caliber array type THz PCA to which a modified photonic crystal structure is applied according to another embodiment of the present disclosure.

Referring to FIG. 16, first and second unit gratings 1601 and 1602 having different nano structures may be alternately arrayed on one row. For example, a first unit grating 1601 has the NE structure and a second unit grating 1602 has the NG structure.

In addition, it is also possible to form a meta electrode 1603 in the unit gratings 1601 and 1602. For example, the meta electrode 1603 may be formed in the first unit grating structure 1601 having the NE structure and the meta electrode 1603 may be a floating electrode.

According to an embodiment of the present disclosure, a nano electrode structure for a plasmon effect and a localized electric field amplification effect may be applied to a large caliber PCA. Accordingly, a THz wave generation efficiency may be improved. In addition, the nano electrode structure may be periodically changed in a large caliber PCA structure to additionally improve the generation efficiency and frequency characteristics. Through this, difficulties in thermal characteristics and optical alignment may be solved and a low photoelectric conversion efficiency may be remarkably improved.

The present disclosure proposes a nano electrode structure capable of reducing saturation of light absorption. The nano electrode structure has an array in which finger type electrodes overlap each other or a prescribed structure is repeated. Through this, the THz wave generation efficiency may be improved and a large caliber array type photonic crystal photomixer may be easily manufactured. In particular, since the nano electrode structure is made in a large caliber array to lower optical density, to improve thermal characteristics, and to reduce a tolerance error in optical alignment. In addition, the size and period of a unit nano structure may be spatially modulated to improve the THz wave generation efficiency and frequency characteristics.

While the present disclosure has been described with reference to exemplary embodiments thereof, the foregoing embodiments should be regarded as illustrative rather than limiting in all aspects. In addition, it should be understood that all changes or modifications derived from the definition and scope of the Claims and their equivalents fall within the scope of the present invention.

What is claimed is:

1. A large caliber terahertz wave generating device having a photonic crystal structure, comprising:
    a first electrode comprising a first line pattern extending in a first direction, a plurality of second line patterns coupled to the first line pattern and extending in a second direction intersecting with the first direction, and a plurality of third line patterns coupled to the first line pattern and extending in the second direction, the plurality of third line patterns being disposed between the plurality of second line patterns and being longer than the plurality of second line patterns; and
    a second electrode disposed to face the first electrode and comprising a fourth line pattern extending in the first direction, a plurality of fifth line patterns coupled to the fourth line pattern and extending in the second direction, and a plurality of sixth line patterns coupled to the fourth line pattern and extending in the second direction, the plurality of sixth line patterns being disposed between the plurality of fifth line patterns and being longer than the plurality of fifth line patterns.

2. The large caliber terahertz wave generating device according to claim 1, wherein the first and fourth line patterns are disposed to face each other, and the pluralities of second, third, fifth, and sixth line patterns are disposed between the first and fourth line patterns.

3. The large caliber terahertz wave generating device according to claim 1, wherein the plurality of second line patterns are disposed to mutually correspond to the plurality of sixth line patterns, the plurality of third line patterns are disposed to mutually correspond to the plurality of fifth line patterns, and the pluralities of third line patterns and sixth line patterns partially overlap in the first direction.

4. The large caliber terahertz wave generating device according to claim 1, wherein the first and second electrodes form one unit grating, and a plurality of unit gratings form one row.

5. The large caliber terahertz wave generating device according to claim 4, wherein first unit gratings and second unit gratings are alternately arrayed on the one row and a first interval between neighboring second and third line patterns comprised in the first unit gratings is different from a second interval between neighboring second and third line patterns comprised in the second unit gratings.

6. The large caliber terahertz wave generating device according to claim 1, wherein the first and second electrodes form one unit grating, and a plurality of unit gratings form a plurality of rows.

7. The large caliber terahertz wave generating device according to claim 6, further comprising:
    a reverse voltage region disposed between the plurality of rows; and
    a metal pattern covering the reverse voltage region.

8. The large caliber terahertz wave generating device according to claim 1, wherein the first electrode comprises the continuously arrayed n second line patterns and the continuously arrayed m third line patterns, wherein the n and m are natural numbers equal to or greater than 2.

9. The large caliber terahertz wave generating device according to claim 8, wherein the plurality of second line patterns and the plurality of fifth line patterns are disposed to mutually correspond to each other, and the plurality of third line patterns and the plurality of sixth line patterns are disposed to mutually correspond to each other.

10. The large caliber terahertz wave generating device according to claim 9, further comprising:
    a meta electrode disposed between the plurality of second line patterns and the plurality of fifth line patterns.

11. The large caliber terahertz wave generating device according to claim 1, wherein the first and second electrodes have a finger type.

12. The large caliber terahertz wave generating device according to claim 1, wherein the terahertz wave generating device is a photoconductive antenna.

13. The large caliber terahertz wave generating device according to claim 1, wherein the terahertz wave generating device is a large caliber array type photonic crystal photomixer.

* * * * *